United States Patent
Yoshida et al.

(10) Patent No.: US 10,211,104 B2
(45) Date of Patent: Feb. 19, 2019

(54) PROCESSING METHOD OF PACKAGE WAFER

(71) Applicant: DISCO CORPORATION, Tokyo (JP)

(72) Inventors: Yuta Yoshida, Tokyo (JP); Hironari Ohkubo, Tokyo (JP)

(73) Assignee: Disco Corporation, Tokyo (JP)

( * ) Notice: Subject to any disclaimer, the term of this patent is extended or adjusted under 35 U.S.C. 154(b) by 3 days.

(21) Appl. No.: 15/677,677

(22) Filed: Aug. 15, 2017

(65) Prior Publication Data

US 2018/0061711 A1 Mar. 1, 2018

(30) Foreign Application Priority Data

Aug. 25, 2016 (JP) .................... 2016-164824

(51) Int. Cl.
| | |
|---|---|
| *H01L 21/78* | (2006.01) |
| *H01L 21/68* | (2006.01) |
| *H01L 21/66* | (2006.01) |
| *H01L 23/544* | (2006.01) |
| *H01L 21/302* | (2006.01) |
| *H01L 21/56* | (2006.01) |
| *H01L 23/12* | (2006.01) |
| *H01L 21/304* | (2006.01) |
| *H01L 23/31* | (2006.01) |

(52) U.S. Cl.
CPC ........... *H01L 21/78* (2013.01); *H01L 21/302* (2013.01); *H01L 21/3043* (2013.01); *H01L 21/56* (2013.01); *H01L 21/561* (2013.01); *H01L 21/681* (2013.01); *H01L 22/20* (2013.01); *H01L 23/12* (2013.01); *H01L 23/544* (2013.01); *H01L 23/3114* (2013.01)

(58) Field of Classification Search
None
See application file for complete search history.

(56) References Cited

U.S. PATENT DOCUMENTS

| | | | | |
|---|---|---|---|---|
| 7,179,723 B2* | 2/2007 | Genda | .................... | B23K 26/18 |
| | | | | 257/E21.599 |
| 7,569,840 B2* | 8/2009 | Morikazu | .............. | B23K 26/04 |
| | | | | 250/491.1 |
| 9,716,040 B2* | 7/2017 | Haimoto | ................. | H01L 21/78 |

(Continued)

FOREIGN PATENT DOCUMENTS

JP  2002-100709  4/2002

*Primary Examiner* — Andres Munoz
(74) *Attorney, Agent, or Firm* — Greer Burns & Crain Ltd.

(57) ABSTRACT

A processing method of a package wafer includes a mold resin removal step of exposing grooves filled with a mold resin of the package wafer in a peripheral surplus region, a holding step of holding the package wafer in such a manner that the grooves are exposed, an orientation adjustment step of causing the grooves to be parallel to a processing-feed direction in which processing feeding of a chuck table is carried out when dividing grooves are formed, a coordinate registration step of imaging both ends of the plural grooves exposed at a peripheral edge and registering coordinate information of both ends or a single side of the grooves from taken images, and a dividing groove forming step of calculating the positions of the dividing grooves to be formed along the grooves based on the registered coordinate information of the grooves and forming the dividing grooves along the grooves.

4 Claims, 14 Drawing Sheets

(56) References Cited

U.S. PATENT DOCUMENTS

| | | | |
|---|---|---|---|
| 2002/0003816 A1* | 1/2002 | Nabesako | H04N 21/426 370/542 |
| 2002/0025616 A1* | 2/2002 | Kamigaki | B23D 59/001 438/200 |
| 2004/0113283 A1* | 6/2004 | Farnworth | H01L 21/3043 257/782 |
| 2009/0197351 A1* | 8/2009 | Morikazu | B23K 26/03 438/5 |
| 2012/0244682 A1* | 9/2012 | Tanaka | B23K 26/0093 438/464 |
| 2016/0035635 A1* | 2/2016 | Tanaka | H01L 22/20 438/7 |
| 2017/0133269 A1* | 5/2017 | Obata | H01L 23/3114 |
| 2017/0213774 A1* | 7/2017 | Lu | H01L 21/68 |
| 2017/0221780 A1* | 8/2017 | Tanaka | B23K 26/364 |

* cited by examiner

| PLANNED DIVIDING LINE NUMBER | COORDINATE INFORMATION OF a1 (X,Y) | COORDINATE INFORMATION OF b1 (X,Y) | POSITION OF c1 (X,Y) | COORDINATE INFORMATION OF a2 (X,Y) | COORDINATE INFORMATION OF b2 (X,Y) | POSITION OF c2 (X,Y) |
|---|---|---|---|---|---|---|
| 1 | $Xa_1, Ya_1$ | $Xb_1, Yb_1$ | $Xc_1, Yc_1$ | $Xa_2, Ya_2$ | $Xb_2, Yb_2$ | $Xc_2, Yc_2$ |
| 2 | | | | | | |
| ⋮ | | | | | | |
| n | | | | | | |

PROCESSING METHOD OF PACKAGE WAFER

BACKGROUND OF THE INVENTION

Field of the Invention

The present invention relates to a processing method of a package wafer.

Description of the Related Art

As methods for dividing a semiconductor wafer into individual device chips, processing methods by a cutting blade or laser beam irradiation are known. It is general that the device chips individually divided are fixed to a motherboard or the like to be wired by a wire or the like and be packaged by a mold resin. However, due to a minute crack or the like in a side surface of the device chip, possibly the crack extends and the device breaks when the device is operated for a long time. Therefore, a package device obtained by covering the side surfaces of device chips by a mold resin to keep the devices from being affected by external environmental factors has been developed (for example, refer to Japanese Patent Laid-open No. 2002-100709).

SUMMARY OF THE INVENTION

When the package device indicated in Japanese Patent Laid-open No. 2002-100709 is manufactured, grooves filled with the mold resin need to be formed in a semiconductor wafer along planned dividing lines. In the case of forming the grooves by a cutting blade, the interval of the grooves often varies in units of μm due to the influence of bending of the cutting blade, expansion and contraction of a shaft of cutting apparatus, and the positioning accuracy. In particular, when a low-dielectric-constant insulator film (Low-k film) is formed on a surface of the semiconductor wafer and the low-dielectric-constant insulator film is removed by laser ablation and then cutting is carried out along shallow grooves resulting from the removal, the vicinity of the shallow grooves becomes hard due to the influence of heat of the laser ablation, which causes the bending of the cutting blade more readily.

When the package device depicted in Japanese Patent Laid-open No. 2002-100709 is manufactured, in processing of further dividing the mold resin with which the grooves of the package wafer are filled to divide the wafer into the individual package devices, the mold resin is not left on a side surface of the package device in some cases if the dividing is carried out at a position distant from the widthwise center of the groove. In particular, if the width of the planned dividing lines is set small in order to increase the number of package devices that can be manufactured from one semiconductor wafer, the possibility that the mold resin is not left on a side surface of the package device becomes high due to variation in the interval of the grooves.

Thus, an object of the present invention is to provide a processing method of a package wafer allowing a mold resin to be left on the side surfaces of package devices.

In accordance with an aspect of the present invention, there is provided a processing method of a package wafer obtained by covering, by a mold resin, a surface of a device region in which a device is formed in each of a plurality of regions partitioned by a plurality of planned dividing lines that intersect and grooves formed along the planned dividing lines in a wafer having the device region and a peripheral surplus region that surrounds the device region in a surface. The processing method includes a mold resin removal step of removing the mold resin along a peripheral edge of the package wafer and exposing the grooves filled with the mold resin in the peripheral surplus region, a holding step of holding the package wafer by a holding surface of a chuck table in such a manner that the grooves filled with the mold resin are exposed, and an orientation adjustment step of rotating the chuck table that holds the package wafer and causing the extension direction of the grooves to be parallel to a processing-feed direction in which processing feeding of the chuck table is carried out when dividing grooves are formed. The processing method also includes a coordinate registration step of, after the orientation adjustment step is carried out, imaging both ends of a plurality of the grooves exposed at the peripheral edge and registering coordinate information of both ends or a single side of the grooves in the holding surface of the chuck table from taken images, and a dividing groove forming step of calculating the positions of the dividing grooves to be formed along the grooves based on the registered coordinate information of the grooves and forming the dividing grooves along the grooves. The dividing grooves are formed corresponding to the positions of the grooves even when the interval of the grooves that are adjacent varies.

Preferably, the coordinate information of both ends of all of the grooves is registered in the coordinate registration step. Preferably, the grooves are sequentially imaged in the circumferential direction along the peripheral edge of the package wafer when the coordinate registration step is carried out. Preferably, the mold resin is removed by a laser beam or a cutting blade in the dividing groove forming step.

In the processing method of a package wafer according to the present invention, the dividing grooves are formed after the positions of the grooves filled with the mold resin are surely registered and therefore each dividing groove is formed at the center of the groove. Thus, an effect that the mold resin can be left on the side surfaces of the package devices is provided. Moreover, because the grooves are detected along the peripheral edge of the package wafer, there is also an effect that the coordinate positions can be efficiently registered.

The above and other objects, features and advantages of the present invention and the manner of realizing them will become more apparent, and the invention itself will best be understood from a study of the following description and appended claims with reference to the attached drawings depicting a preferred embodiment of the invention.

DETAILED DESCRIPTION OF THE PREFERRED EMBODIMENT

A preferred embodiment for carrying out the present invention will be described in detail with reference to the drawings. The present invention is not limited by the contents described in the following embodiment. Furthermore, in constituent elements described below, what can be easily assumed by those skilled in the art and what are substantially identical are included. Moreover, configurations described below can be combined as appropriate. In addition, various kinds of omission, replacement, or change can be made without departing from the gist of the present invention.

Figure 1A:
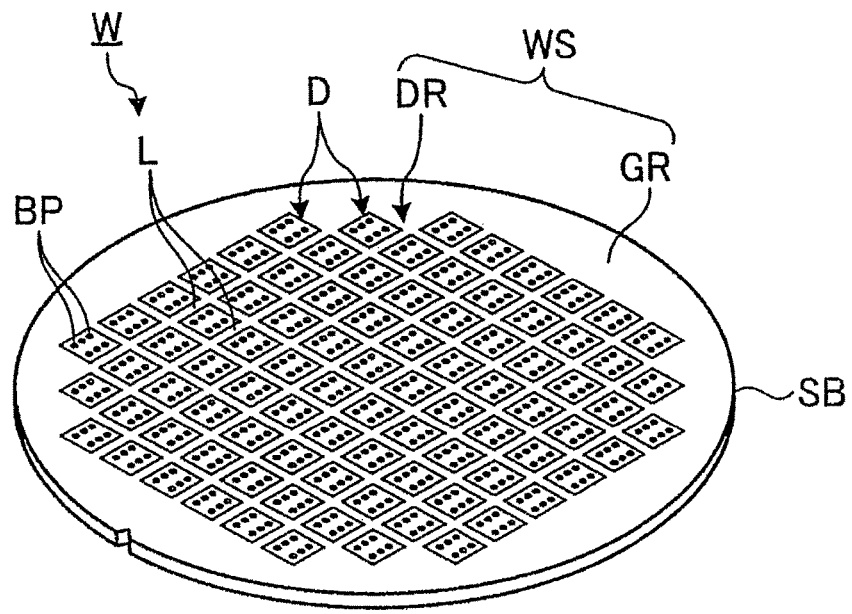
FIG. 1A is a perspective view of a wafer that forms a package wafer as a processing target of a processing method of a package wafer according to a preferred embodiment.
Figure 1B:
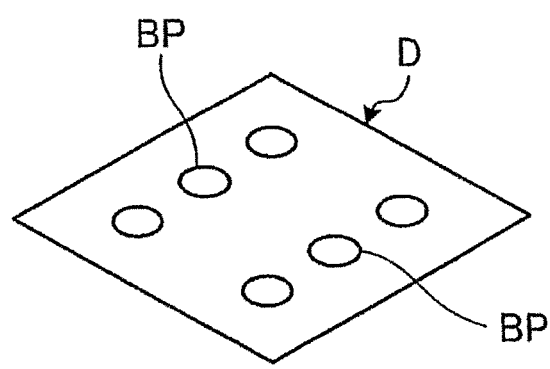
FIG. 1B is a perspective view of a device of the wafer depicted in FIG. 1A.

A processing method of a package wafer according to a preferred embodiment will be described with reference to the drawings. A package wafer PW depicted in FIG. 2 as a processing target of the processing method of a package wafer according to the preferred embodiment is formed of a wafer W depicted in FIG. 1A. The wafer W depicted in FIG. 1A is a circular-disc-shaped semiconductor wafer or optical device wafer whose substrate SB is composed of silicon, sapphire, gallium arsenic, or the like in the preferred embodiment. As depicted in FIG. 1A, the wafer W has, in a front surface WS, a device region DR in which a device D is formed in each of plural regions partitioned by plural planned dividing lines L that intersect (in the preferred embodiment, perpendicularly intersect) and a peripheral surplus region GR that surrounds the device region DR. As depicted in FIG. 1B, bumps BP that are plural protruding electrodes are formed on the front surface of the device D.

Figure 2:
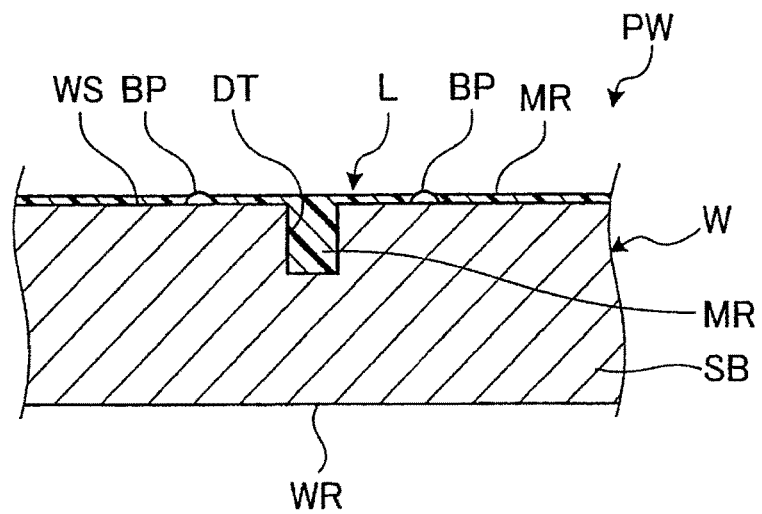
FIG. 2 is a sectional view of the major part of the package wafer as the processing target of the processing method of a package wafer according to the preferred embodiment.
Figure 3:
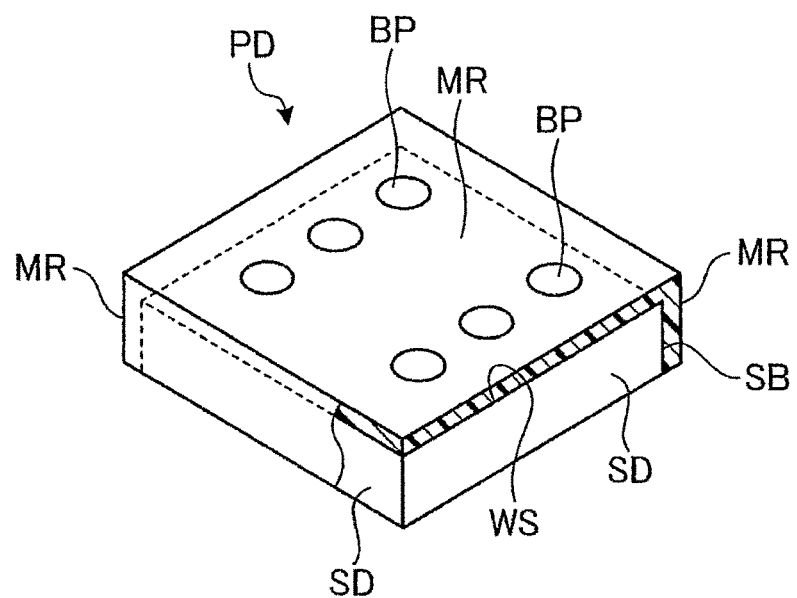
FIG. 3 is a perspective view depicting a package device obtained by dividing the package wafer depicted in FIG. 2.

As depicted in FIG. 2, the wafer W is processed to the package wafer PW through covering of the front surface WS of the device region DR and the grooves DT formed along the planned dividing lines L by a mold resin MR. The package wafer PW is divided into package devices PD depicted in FIG. 3 along the planned dividing lines L. In the package device PD, the front surface WS and all side surfaces SD of the substrate SB are covered by the mold resin MR and the bumps BP protrude from the mold resin MR and are exposed.

Figure 4:
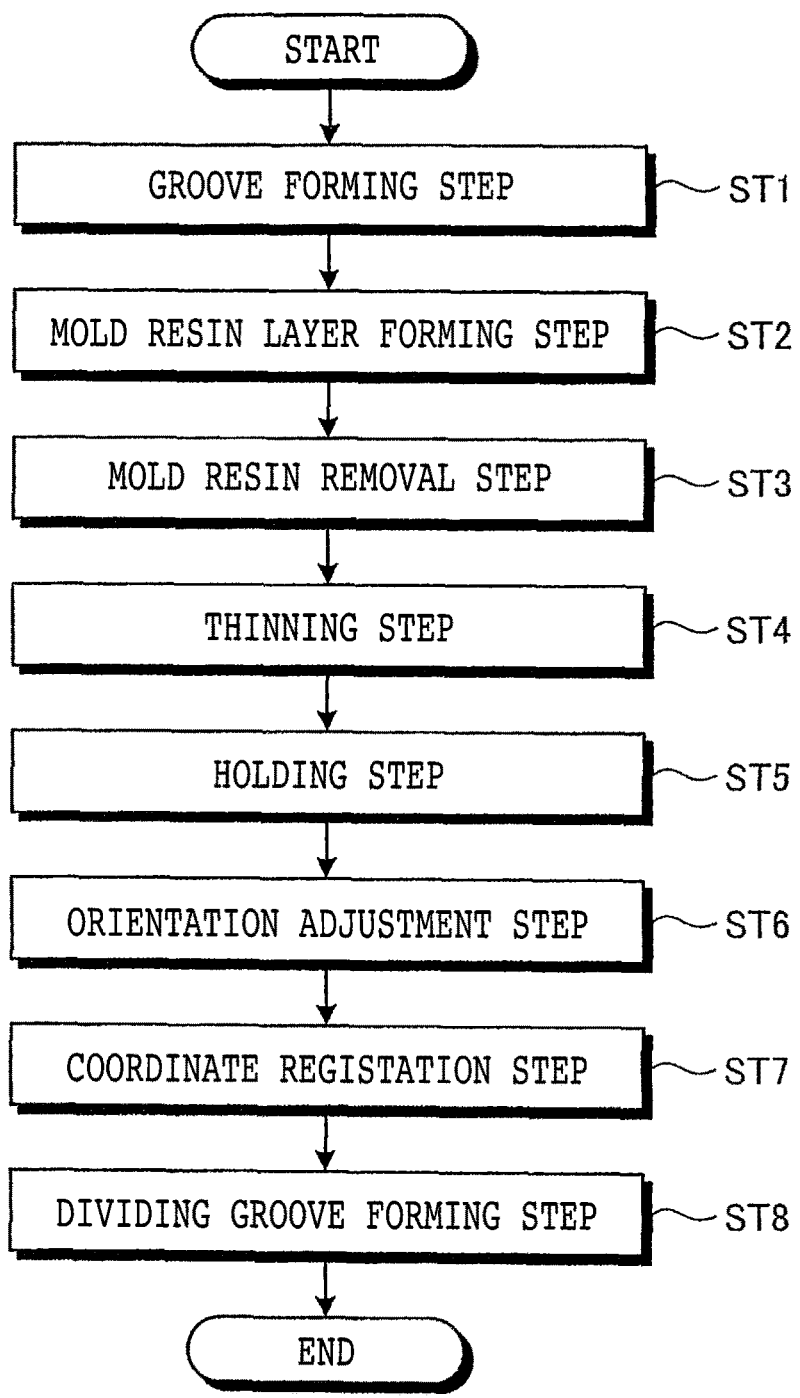
FIG. 4 is a flowchart depicting the flow of the processing method of a package wafer according to the preferred embodiment.

Next, the processing method of a package wafer will be described with reference to the drawings. FIG. 4 is a flowchart depicting the flow of the processing method of a package wafer according to the preferred embodiment. The processing method of the package wafer PW according to the preferred embodiment (hereinafter, represented simply as the processing method) is a method in which the package wafer PW depicted in FIG. 2 is cut along the planned dividing lines L to divide (referred to also as dice) the package wafer PW into the package devices PD depicted in FIG. 3.

As depicted in FIG. 4, the processing method includes a groove forming step ST1, a mold resin layer forming step ST2, a mold resin removal step ST3, a thinning step ST4, a holding step ST5, an orientation adjustment step ST6, a coordinate registration step ST7, and a dividing groove forming step ST8. In the processing method according to the preferred embodiment, the thinning step ST4 is carried out after the mold resin removal step ST3 is carried out. However, in the present invention, the thinning step ST4 may be carried out before the mold resin removal step ST3.

Figure 5:
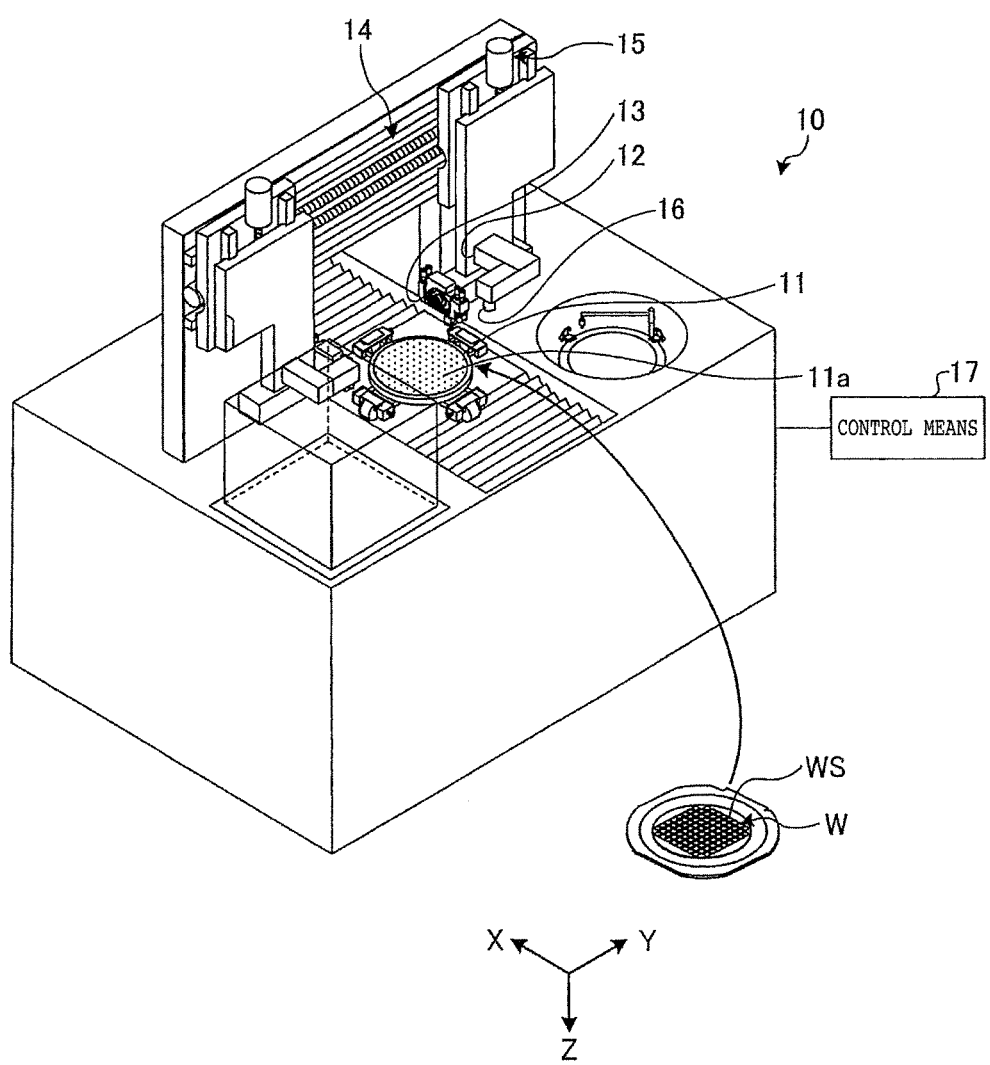
FIG. 5 is a perspective view depicting the schematic configuration of cutting apparatus used for a groove forming step of the processing method of a package wafer depicted in FIG. 4.
Figure 6A:
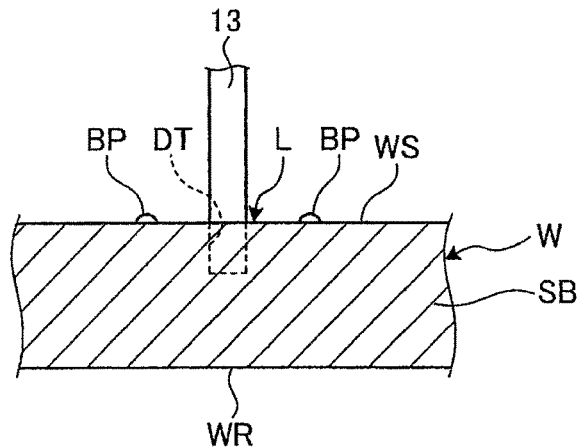
FIG. 6A is a sectional view of the major part of the wafer in the groove forming step of the processing method of a package wafer depicted in FIG. 4.
Figure 6B:
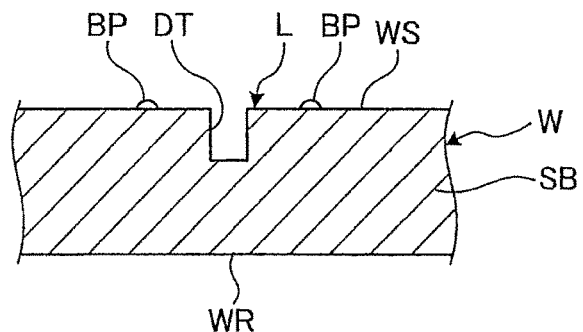
FIG. 6B is a sectional view of the major part of the wafer after the groove forming step of the processing method of a package wafer depicted in FIG. 4.

The groove forming step ST1 is a step of forming the grooves DT in the respective planned dividing lines L of the wafer W from the front surface WS. The groove forming step ST1 forms the grooves DT along the longitudinal direction of the respective planned dividing lines L in the respective planned dividing lines L. The depth of the grooves DT formed in the groove forming step ST1 is equal to or larger than the finished thickness of the substrate SB of the package devices PD. In the preferred embodiment, in the groove forming step ST1, a back surface WR on the back side of the front surface WS of the wafer W is held by suction on a holding surface 11a of a chuck table 11 of cutting apparatus 10 depicted in FIG. 5. Then, by using a cutting blade 13 of cutting means 12 as depicted in FIG. 6A, the groove DT is formed in the front surface WS of the wafer W as depicted in FIG. 6B.

Figure 6C:
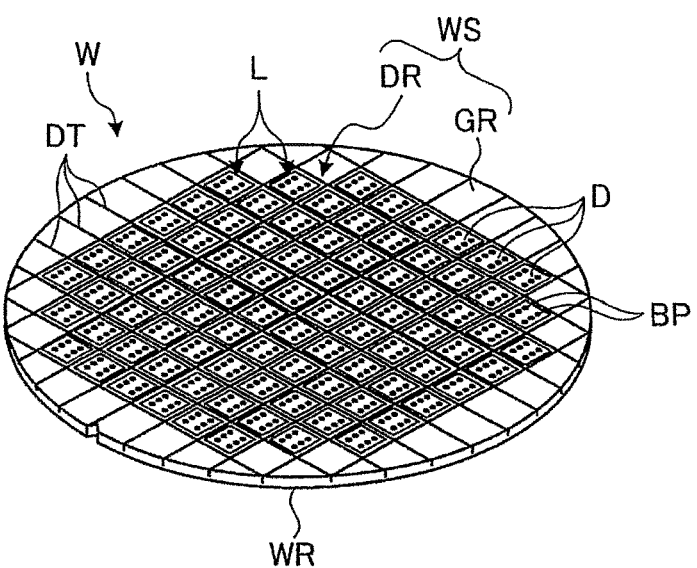
FIG. 6C is a perspective view of the wafer after the groove forming step of the processing method of a package wafer depicted in FIG. 4.

In the groove forming step ST1, the chuck table 11 is moved by X-axis movement means (not depicted) in an X-axis direction parallel to the horizontal direction and the cutting blade 13 of the cutting means 12 is moved by Y-axis movement means 14 in a Y-axis direction that is parallel to the horizontal direction and is orthogonal to the X-axis direction. Furthermore, the cutting blade 13 of the cutting means 12 is moved by Z-axis movement means 15 in a Z-axis direction parallel to the vertical direction. Thereby, as depicted in FIG. 6C, the grooves DT are formed in the front surface WS of the respective planned dividing lines L of the wafer W. In the present invention, the groove forming step ST1 may form the grooves DT by ablation processing with use of a laser beam.

Furthermore, the cutting apparatus 10 includes a rotational drive source (not depicted) that rotates the chuck table 11 around an axis parallel to the Z-axis direction, imaging means 16 that images the wafer W and the package wafer PW for alignment, and control means 17 that controls the X-axis movement means, the Y-axis movement means 14, the Z-axis movement means 15, the rotational drive source, and the cutting means 12. The control means 17 is a computer that causes the cutting apparatus 10 to carry out processing operation for the wafer W and the package wafer PW.

The control means 17 has an arithmetic processing device having a microprocessor such as a central processing unit (CPU), a storing device having a memory such as a read only memory (ROM) or a random access memory (RAM), and an input-output interface device. The arithmetic processing device of the control means 17 executes arithmetic processing in accordance with a computer program stored in the storing device and outputs a control signal for controlling the cutting apparatus 10 to the above-described constituent elements of the cutting apparatus 10 through the input-output interface device. Furthermore, the control means 17 is connected to display means (not depicted) that displays the state of processing operation, images, and so forth, and is formed of a liquid crystal display device or the like and input means used when an operator registers information on the contents of processing and so forth. The input means is formed of at least one of a touch panel provided in the display means, a keyboard, and so forth.

Figure 7:
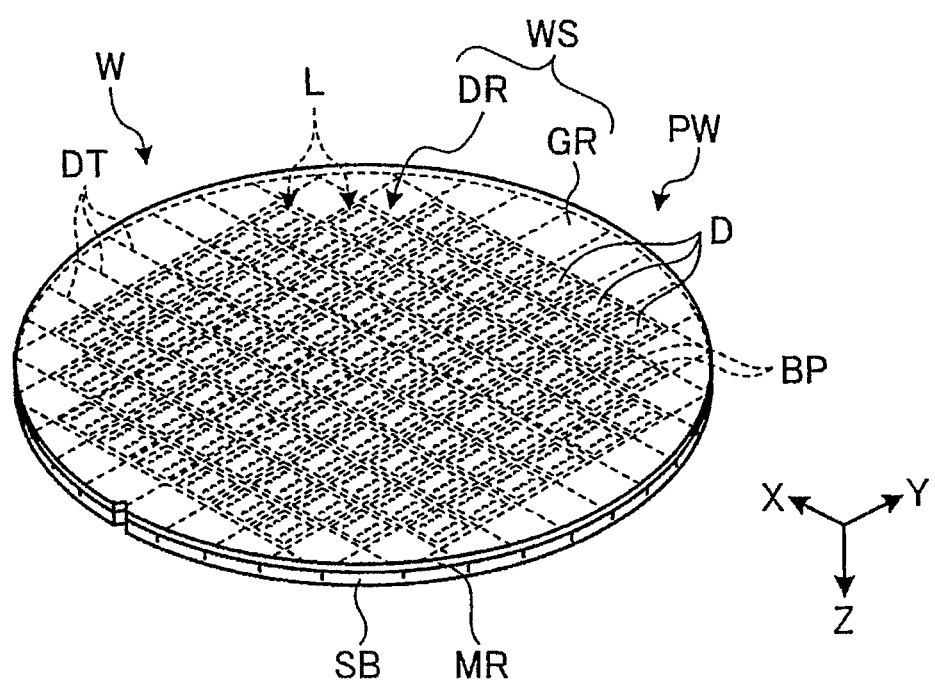
FIG. 7 is a perspective view of the package wafer after a mold resin layer forming step of the processing method of a package wafer depicted in FIG. 4.

The mold resin layer forming step ST2 is a step of covering the front surface WS of the device region DR and the grooves DT in the wafer W by the mold resin MR to process the wafer W to the package wafer PW as depicted in FIG. 7. In the preferred embodiment, in the mold resin layer forming step ST2, the back surface WR of the wafer W is held on a holding table of resin coating apparatus (not depicted). Then, the mold resin MR is dropped onto the front surface WS of the wafer W and the holding table is rotated around an axis parallel to the vertical direction. Thereby, the whole of the front surface WS and the grooves DT are covered by the mold resin MR. In the preferred embodiment, a thermosetting resin is used as the mold resin MR. The mold resin layer forming step ST2 heats the mold resin MR covering the whole of the front surface WS and the grooves DT in the wafer W to cure the mold resin MR. Furthermore, in the preferred embodiment, the bumps BP are exposed when the whole of the front surface WS and the grooves DT are covered by the mold resin MR. However, in the present invention, the bumps BP may be surely exposed by carrying out polishing processing for the cured mold resin MR.

Figure 8A:
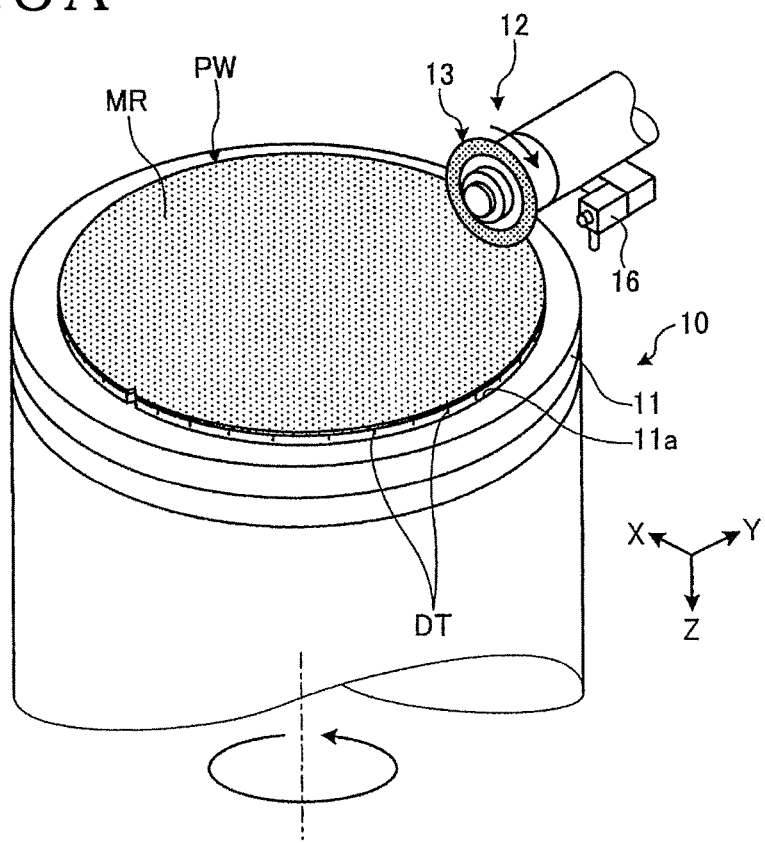
FIG. 8A is a perspective view depicting a mold resin removal step of the processing method of a package wafer depicted in FIG. 4.
Figure 8B:
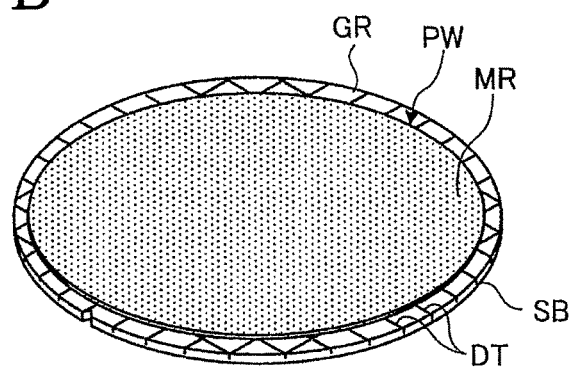
FIG. 8B is a perspective view of the package wafer after the mold resin removal step of the processing method of a package wafer depicted in FIG. 4.

The mold resin removal step ST3 is a step of removing the mold resin MR along the peripheral edge of the package wafer PW and exposing the grooves DT filled with the mold resin MR in the peripheral surplus region GR. In the preferred embodiment, the mold resin removal step ST3 removes the mold resin MR over the whole circumference of the peripheral edge of the peripheral surplus region GR of the package wafer PW. In the preferred embodiment, in the mold resin removal step ST3, similarly to the groove forming step ST1, as depicted in FIG. 8A, the back surface WR of the package wafer PW is held by suction on the holding surface 11a of the chuck table 11 of the cutting apparatus 10. Then, the cutting blade 13 is caused to cut into the mold resin MR on the peripheral edge of the peripheral surplus region GR until reaching the substrate SB while the rotational drive source is caused to rotate the chuck table 11 around the axis parallel to the Z-axis direction. As depicted in FIG. 8B, the mold resin removal step ST3 removes the mold resin MR at the peripheral edge of the peripheral surplus region GR of the package wafer PW. In FIGS. 8A and 8B, the bumps BP are omitted.

Figure 9A:
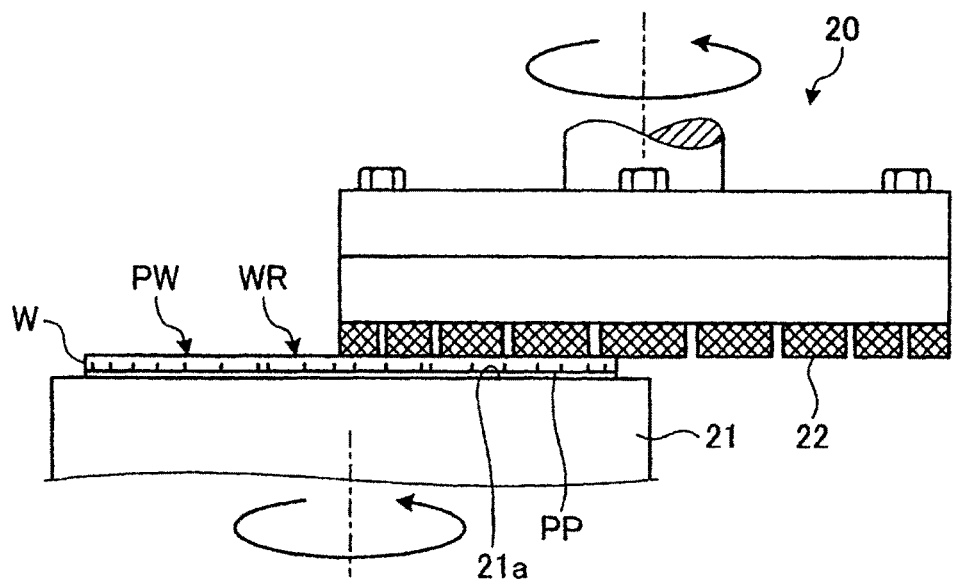
FIG. 9A is a side view depicting a thinning step of the processing method of a package wafer depicted in FIG. 4.
Figure 9B:
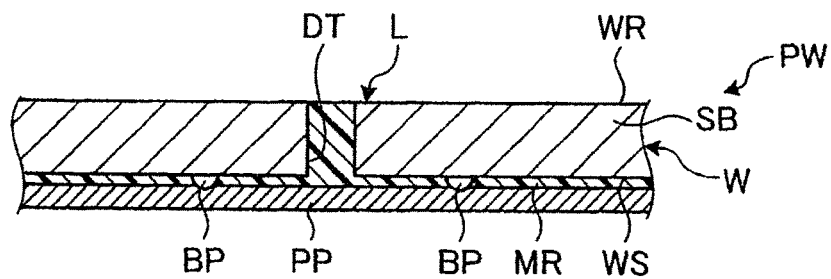
FIG. 9B is a sectional view of the package wafer after the thinning step of the processing method of a package wafer depicted in FIG. 4.

The thinning step ST4 is a step of thinning the substrate SB of the package wafer PW to the finished thickness. In the thinning step ST4, as depicted in FIG. 9A, a protective member PP is stuck to the side of the mold resin MR of the package wafer PW and then the protective member PP is held by suction on a holding surface 21a of a chuck table 21 of grinding apparatus 20. Then, an abrasive wheel 22 is caused to abut against the back surface WR of the package wafer PW and the chuck table 21 and the abrasive wheel 22 are rotated around axes to carry out grinding processing for the back surface WR of the package wafer PW. As depicted in FIG. 9B, the thinning step ST4 thins the package wafer PW until the mold resin MR with which the grooves DT are filled is exposed.

Figure 10:
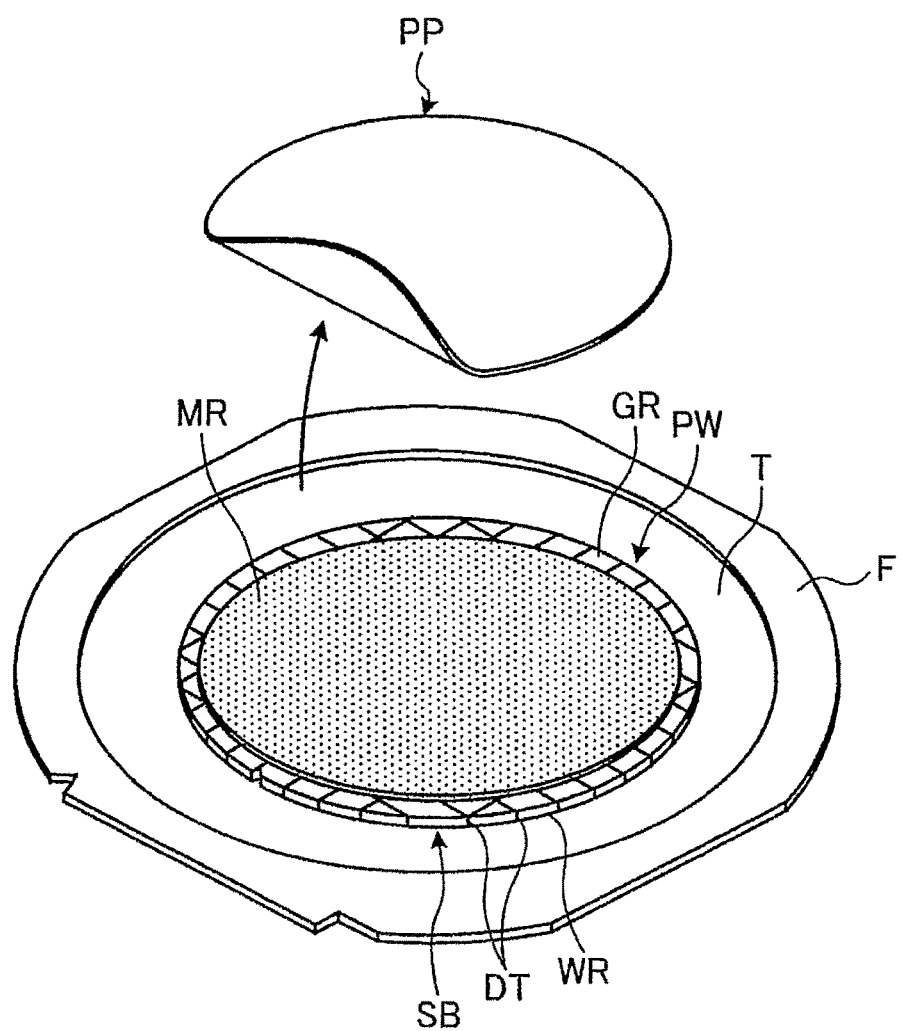
FIG. 10 is a perspective view depicting the state in which the package wafer depicted in FIG. 9B is stuck to a dicing tape.
Figure 11:
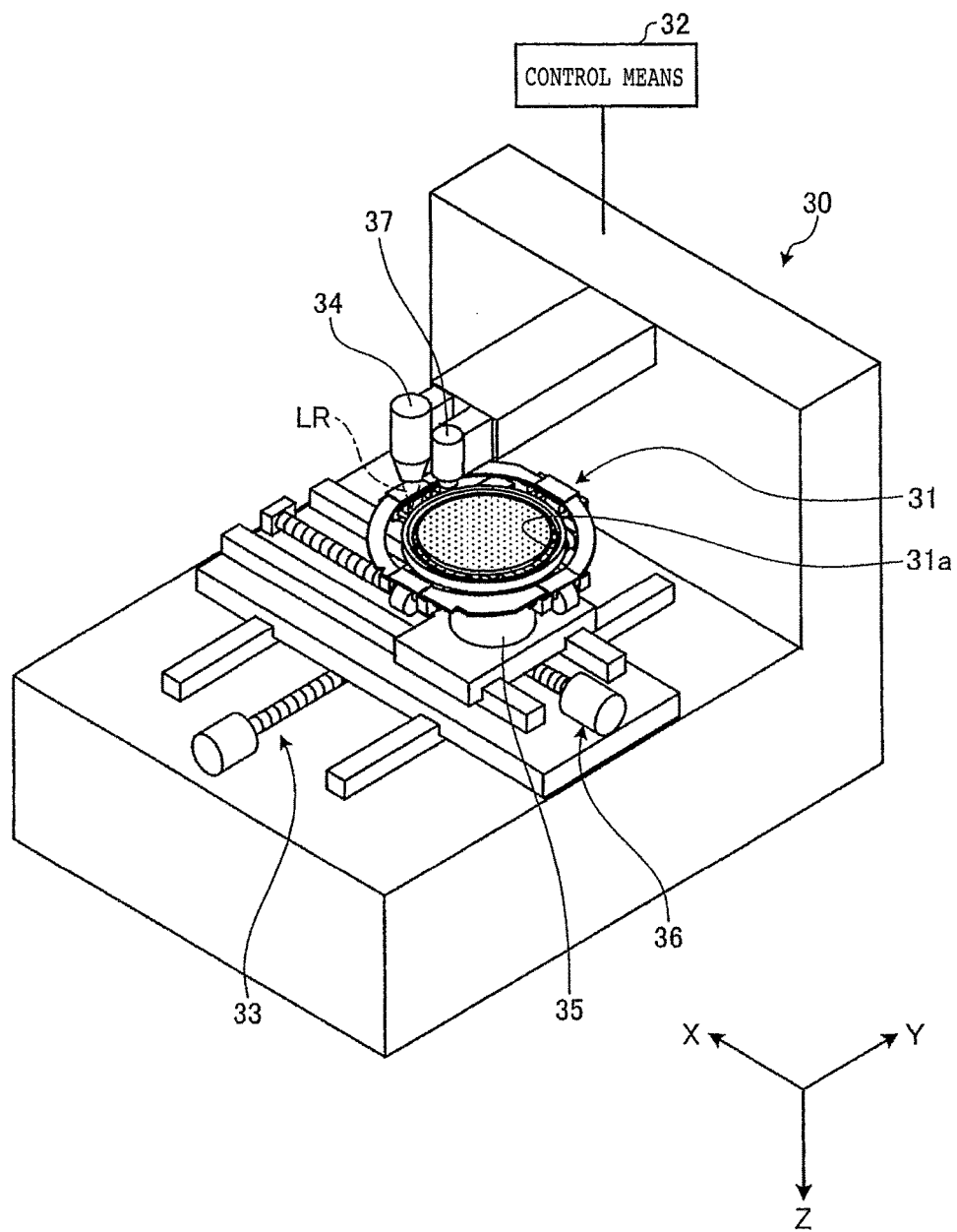
FIG. 11 is a perspective view depicting a holding step of the processing method of a package wafer depicted in FIG. 4.

After the thinning step ST4, as depicted in FIG. 10, the back surface WR of the package wafer PW is stuck to a dicing tape T having the periphery to which a ring-shaped frame F is stuck and the protective member PP is peeled off from the front surface WS. The holding step ST5 is a step of holding the package wafer PW by suction by a holding surface 31a of a chuck table 31 of laser processing apparatus 30 in such a manner that the grooves DT filled with the mold resin MR are exposed at the periphery of the package wafer PW.

The laser processing apparatus 30 moves the chuck table 31 by Y-axis movement means 33 in a Y-axis direction that is an indexing-feed direction and is parallel to the horizontal direction, and causes laser beam irradiation means 34 to be opposed to one planned dividing line L among the plural planned dividing lines L. Furthermore, the laser processing apparatus 30 rotates the chuck table 31 by a rotational drive source 35 around a Z-axis parallel to the vertical direction and causes the planned dividing line L opposed to the laser beam irradiation means 34 to be parallel to an X-axis direction that is a processing-feed direction and is parallel to the horizontal direction and is orthogonal to the Y-axis direction. The laser processing apparatus 30 causes an X-axis movement means 36 to move the chuck table 31 in the X-axis direction while emitting a laser beam LR from the laser beam irradiation means 34, and irradiates the planned dividing line L opposed to the laser beam irradiation means 34 with the laser beam LR to carry out ablation processing.

Furthermore, the laser processing apparatus 30 includes imaging means 37 that images the package wafer PW for alignment and control means 32 that controls the X-axis movement means 36, the Y-axis movement means 33, the rotational drive source 35, and the laser beam irradiation means 34. The control means 32 is a computer that causes the laser processing apparatus 30 to carry out processing operation for the package wafer PW.

The control means 32 has an arithmetic processing device having a microprocessor such as a CPU, a storing device having a memory such as a ROM or a RAM, and an input-output interface device. The arithmetic processing device of the control means 32 executes arithmetic processing in accordance with a computer program stored in the storing device and outputs a control signal for controlling the laser processing apparatus 30 to the above-described constituent elements of the laser processing apparatus 30 through the input-output interface device. Furthermore, the control means 32 is connected to display means (not depicted) that displays the state of processing operation, images, and so forth, and is formed of a liquid crystal display device or the like and input means used when an operator registers information on the contents of processing and so forth. The input means is formed of at least one of a touch panel provided in the display means, a keyboard, and so forth.

Figure 12:
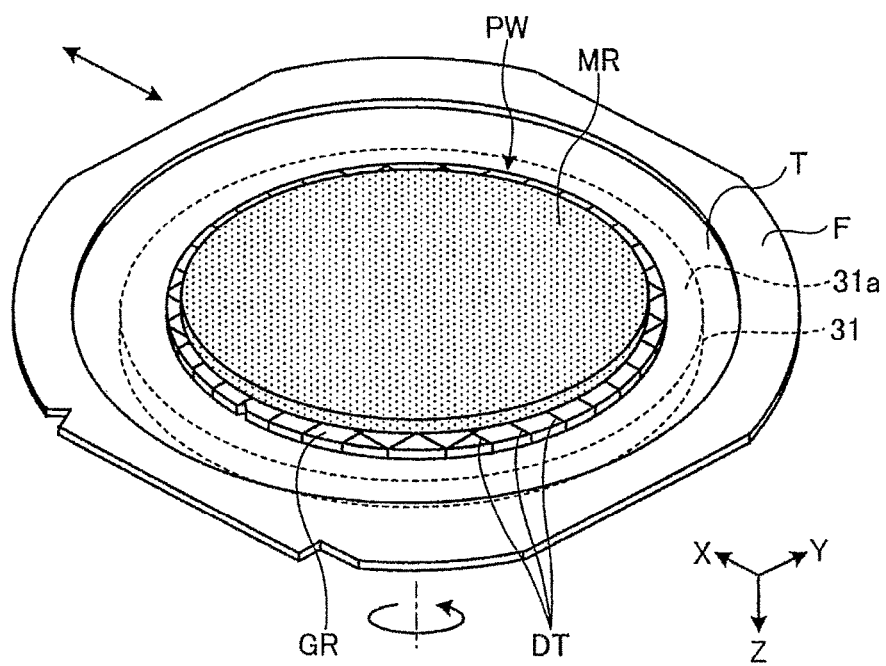
FIG. 12 is a perspective view depicting an orientation adjustment step of the processing method of a package wafer depicted in FIG. 4.
Figures 17, 18:
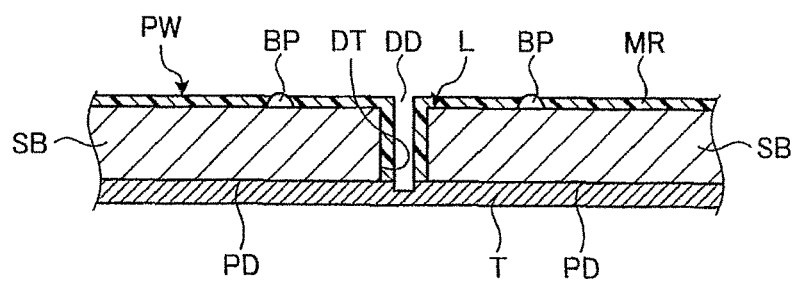
FIG. 17 is a diagram depicting one example of the coordinates of grooves registered in the coordinate registration step of the processing method of a package wafer depicted in FIG. 4.
FIG. 18 is a sectional view of the major part of the package wafer after a dividing groove forming step of the processing method of a package wafer depicted in FIG. 4.

The orientation adjustment step ST6 is a step of causing the rotational drive source 35 to rotate the chuck table 31 around the axis and causing the longitudinal direction of the grooves DT as the extension direction of the grooves DT exposed at the peripheral edge of the peripheral surplus region GR to be parallel to the X-axis direction, which is the processing-feed direction in which processing feeding of the chuck table 31 is carried out when dividing grooves DD depicted in FIG. 18 are formed. In the orientation adjustment step ST6, based on an image of the groove DT formed in the planned dividing line L, taken by the imaging means 37, the control means 32 causes the rotational drive source 35 to rotate the chuck table 31 around the axis and causes the grooves DT formed in one set of the planned dividing lines L among the planned dividing lines L orthogonal to each other to be parallel to the X-axis direction as depicted in FIG. 12.

Figure 15:
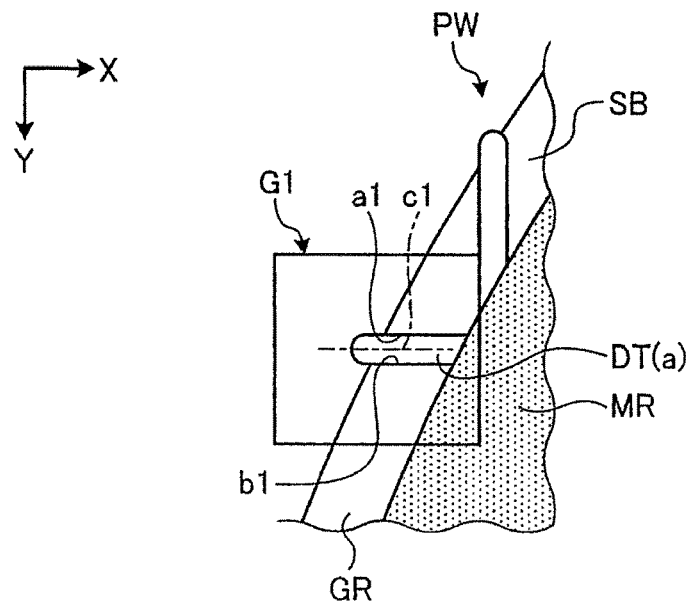
FIG. 15 is a diagram depicting one example of a taken image taken in the coordinate registration step of the processing method of a package wafer depicted in FIG. 4.
Figure 16:
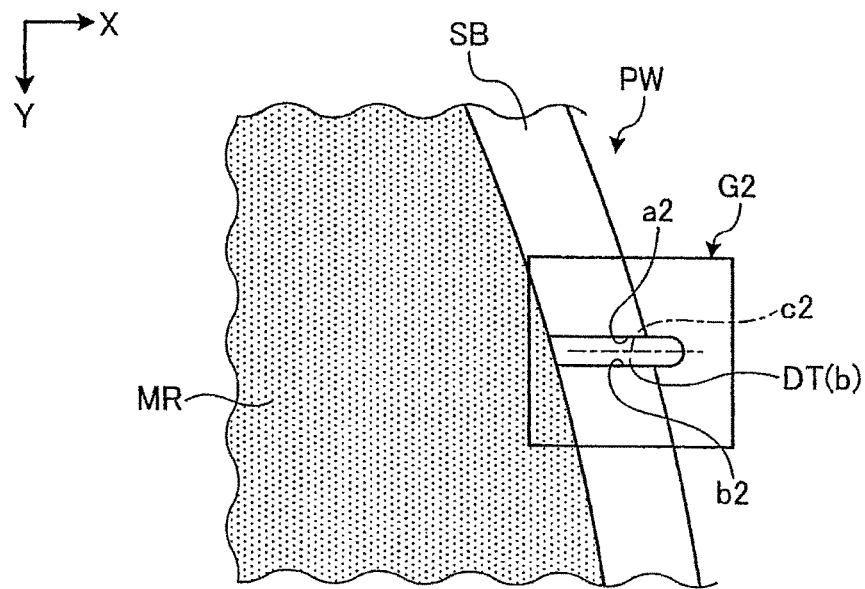
FIG. 16 is a diagram depicting another example of the taken image taken in the coordinate registration step of the processing method of a package wafer depicted in FIG. 4.

The coordinate registration step ST7 is a step of, after the orientation adjustment step ST6 is carried out, imaging both ends a and b of plural grooves DT exposed at the peripheral edge of the peripheral surplus region GR by the imaging means 37 and registering coordinate information (X, Y) of both ends a and b or a single side of the grooves DT in the holding surface 31a of the chuck table 31 from taken images G1 and G2 depicted in FIG. 15 and FIG. 16, taken by the imaging means 37. The coordinate information (X, Y) of the groove DT indicates the position in the X-axis direction and the position in the Y-axis direction. In the coordinate registration step ST7, the arithmetic processing device of the control means 32 calculates the coordinate information (X, Y) and stores, i.e. registers, the coordinate information (X, Y) in the storing device.

Figure 13:
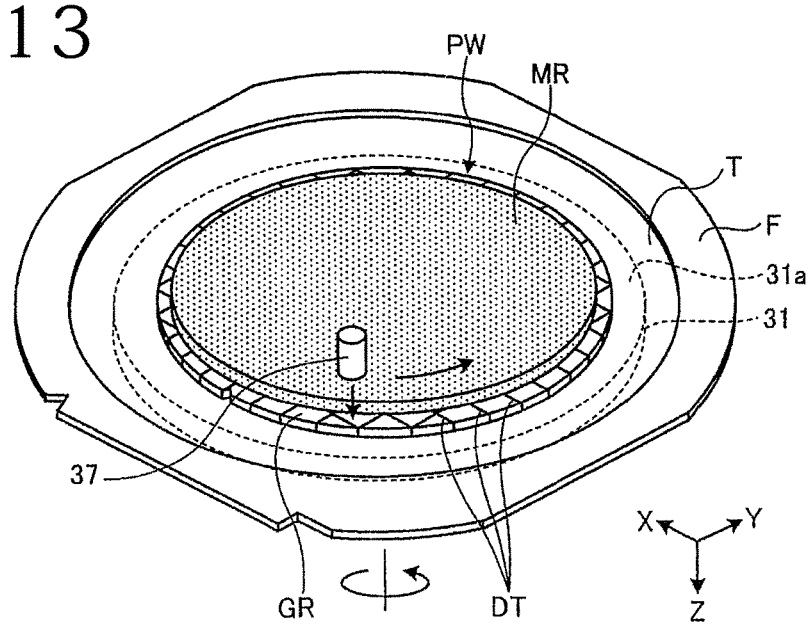
FIG. 13 is a perspective view depicting a coordinate registration step of the processing method of a package wafer depicted in FIG. 4.
Figure 14:
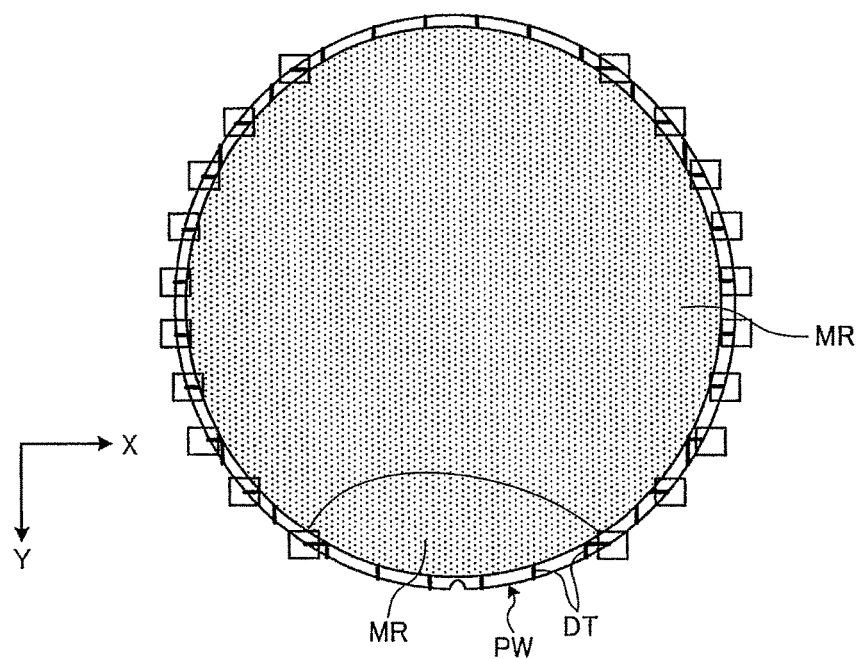
FIG. 14 is a plan view depicting the coordinate registration step of the processing method of a package wafer depicted in FIG. 4.

The coordinate registration step ST7 calculates the position of the package wafer PW from the images taken by the imaging means 37. In this calculation, for example, the coordinates of three points at the peripheral edge of the package wafer PW are detected and the coordinates of the center of the package wafer PW are figured out. Then, the position of the package wafer PW in the holding surface 31a is figured out from the diameter of the package wafer PW registered in advance. Based on the detected position information of the package wafer PW, as depicted in FIG. 13, the chuck table 31 and the imaging means 37 are relatively moved along the peripheral edge of the package wafer PW by the X-axis movement means 36 and the Y-axis movement means 33 and the grooves DT are sequentially imaged in the circumferential direction along the peripheral edge of the package wafer PW. Furthermore, in the preferred embodiment, as depicted in FIG. 14, in the coordinate registration step ST7, the control means 32 causes the imaging means 37 to image the grooves DT formed in one set of the planned dividing lines L parallel to the X-axis direction and thereafter causes the rotational drive source 35 to rotate the chuck table 31 around the axis by 90 degrees. Then, the control means 32 causes the imaging means 37 to image the grooves DT formed in the other set of the planned dividing lines L parallel to the X-axis direction to image both ends a and b of all grooves DT and register coordinate information (X, Y). In the preferred embodiment, the coordinate registration step ST7 registers the coordinate information (X, Y) of both ends a and b of all grooves DT. However, in the present invention, the coordinate information (X, Y) of both ends a and b of the grooves DT at every interval corresponding to a predetermined number of grooves DT prescribed in advance may be registered.

In the coordinate registration step ST7, the control means 32 extracts the groove DT from the taken image G1 in FIG. 15 and calculates a position Xa1 in the X-axis direction and a position Ya1 in the Y-axis direction regarding one edge a1 of the groove DT in the width direction at one end a of the groove DT in the longitudinal direction. Then, the control means 32 registers the positions Xa1 and Ya1 as the coordinate information (X, Y) of the one edge a1 of the groove DT in association with the groove DT as depicted in FIG. 17. In the coordinate registration step ST7, the control means 32 calculates a position Xb1 in the X-axis direction and a position Yb1 in the Y-axis direction regarding the other edge b1 of the groove DT in the width direction at the one end a of the groove DT in the longitudinal direction, and registers the positions Xb1 and Yb1 as the coordinate information (X, Y) of the other edge b1 of the groove DT in association with the groove DT as depicted in FIG. 17.

Furthermore, in the coordinate registration step ST7, the control means 32 extracts the groove DT from the taken image G2 in FIG. 16 and calculates a position Xa2 in the X-axis direction and a position Ya2 in the Y-axis direction regarding one edge a2 of the groove DT in the width direction at the other end b of the groove DT in the longitudinal direction. Then, the control means 32 registers the positions Xa2 and Ya2 as the coordinate information (X, Y) of the one edge a2 of the groove DT in association with the groove DT as depicted in FIG. 17. In the coordinate registration step ST7, the control means 32 calculates a position Xb2 in the X-axis direction and a position Yb2 in the Y-axis direction regarding the other edge b2 of the groove DT in the width direction at the other end b of the groove DT in the longitudinal direction, and registers the positions Xb2 and Yb2 as the coordinate information (X, Y) of the other edge b2 of the groove DT in association with the groove DT as depicted in FIG. 17.

In the preferred embodiment, in the coordinate registration step ST7, the control means 32 registers the pieces of coordinate information Xa1, Ya1, Xb1, Yb1, Xa2, Ya2, Xb2, and Yb2 of both ends a and b of all grooves DT in the longitudinal direction. However, the control means 32 may register the pieces of coordinate information Xa1, Ya1, Xb1, and Yb1 of the one end a of all grooves DT in the longitudinal direction. Furthermore, in the present invention, the control means 32 may register the pieces of coordinate information Xa1, Ya1, Xb1, Yb1, Xa2, Ya2, Xb2, and Yb2 of both ends a and b or the one end a of the grooves DT at every interval corresponding to a predetermined number of grooves DT prescribed in advance. Moreover, in the preferred embodiment, in the coordinate registration step ST7, the control means 32 registers the pieces of coordinate information Xa1, Ya1, Xb1, Yb1, Xa2, Ya2, Xb2, and Yb2 of both ends a and b closer to the center by about 1 mm to 3 mm than the outer edge of the package wafer PW in the longitudinal direction of the groove DT. Due to this, even if the cutting blade 13 bends when entering the peripheral edge of the package wafer PW and the groove DT meanders near the entrance or near the exit, the influence thereof can be excluded.

The dividing groove forming step ST8 is a step of calculating positions Xc1, Yc1, Xc2, and Yc2 of the dividing grooves DD that are to be formed along the grooves DT and are depicted in FIG. 18 based on the registered pieces of coordinate information Xa1, Ya1, Xb1, Yb1, Xa2, Ya2, Xb2, and Yb2 of the grooves DT and forming the dividing grooves DD along the grooves DT. The dividing groove DD is a groove for dividing the mold resin MR with which the groove DT is filled to divide the package wafer PW into the package devices PD.

In the dividing groove forming step ST8, the control means 32 calculates the position Xc1 in the X-axis direction and the position Yc1 in the Y-axis direction regarding the center c1 of each groove DT in the width direction at the one end a of the groove DT in the longitudinal direction. In the dividing groove forming step ST8, the control means 32 calculates the position Xc2 in the X-axis direction and the position Yc2 in the Y-axis direction regarding the center c2 of each groove DT in the width direction at the other end b of the groove DT in the longitudinal direction as the positions of the dividing groove DD.

In the dividing groove forming step ST8, based on the positions Xc1, Yc1, Xc2, and Yc2 of the dividing grooves DD calculated by the control means 32, the X-axis movement means 36 and the Y-axis movement means 33 are controlled and the mold resin MR with which the respective grooves DT are filled is irradiated with the laser beam LR to form the dividing grooves DD as depicted in FIG. 18. The dividing groove forming step ST8 forms the dividing grooves DD in such a manner as to bisect the mold resin MR in the groove DT by the laser beam LR. As above, in the processing method according to the preferred embodiment, based on the positions Xc1, Yc1, Xc2, and Yc2 of the dividing grooves DD calculated by the control means 32, the X-axis movement means 36 and the Y-axis movement means 33 are controlled and the mold resin MR with which the respective grooves DT are filled is irradiated with the laser beam LR. Thus, the dividing grooves DD are formed in such a manner that the dividing groove DD bisects the mold resin MR in the groove DT corresponding to the position of the groove DT even when the interval of adjacent grooves DT varies.

In the preferred embodiment, the laser processing apparatus 30 is used in the holding step ST5, the orientation adjustment step ST6, the coordinate registration step ST7, and the dividing groove forming step ST8. However, in the present invention, the cutting apparatus 10 depicted in FIG. 5 may be used. In short, in the present invention, in the dividing groove forming step ST8, the dividing grooves DD may be formed by removing the mold resin MR with which the inside of the grooves DT is filled by the cutting blade 13.

In the processing method according to the preferred embodiment, the dividing grooves DD are formed after registering the coordinate information (X, Y) of the grooves DT with which the mold resin MR is filled. This provides an effect that the mold resin MR with which the inside of the grooves DT is filled can be bisected by the dividing grooves DD and the mold resin MR can be left on the side surfaces SD of the substrate SB of the package devices PD. Moreover, in the processing method, the grooves DT are detected along the peripheral edge of the package wafer PW. This provides an effect that the coordinate information (X, Y) can be efficiently registered.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a package wafer obtained by covering, by a mold resin, a surface of a device region in which a device is formed in each of a plurality of regions partitioned by a plurality of planned dividing lines that intersect and grooves formed along the plurality of planned dividing lines in a wafer having the device region and a peripheral surplus region that surrounds the device region, the processing method comprising:

a mold resin removal step of removing the mold resin along a peripheral edge of the package wafer and exposing the grooves filled with the mold resin in the peripheral surplus region;

a holding step of holding the package wafer by a holding surface of a chuck table in such a manner that the grooves filled with the mold resin are exposed;

an orientation adjustment step of rotating the chuck table that holds the package wafer and causing an extension direction of the grooves to be parallel to a processing-feed direction in which processing feeding of the chuck table is carried out when dividing grooves are formed;

a coordinate registration step of, after the orientation adjustment step is carried out, imaging both ends of a plurality of the grooves exposed at the peripheral edge and registering coordinate information of both ends or a single side of the grooves in the holding surface of the chuck table from taken images; and a dividing groove forming step of calculating positions of dividing grooves to be formed along the grooves based on the registered coordinate information of the grooves and forming the dividing grooves along the grooves, wherein the dividing grooves are formed corresponding to positions of the grooves even when an interval of the grooves that are adjacent varies.

2. The processing method of a package wafer according to claim 1, wherein the coordinate information of both ends of all of the grooves is registered in the coordinate registration step.

3. The processing method of a package wafer according to claim 1, wherein the grooves are sequentially imaged in a circumferential direction along the peripheral edge of the package wafer when the coordinate registration step is carried out.

4. The processing method of a package wafer according to claim 1, wherein the mold resin is removed by a laser beam or a cutting blade in the dividing groove forming step.

* * * * *